United States Patent
Jiang et al.

(10) Patent No.: US 11,359,276 B2
(45) Date of Patent: Jun. 14, 2022

(54) SELF-SUPPORTING ULTRA-FINE NANOCRYSTALLINE DIAMOND THICK FILM

(71) Applicant: NINGBO INSTITUTE OF MATERIALS TECHNOLOGY & ENGINEERING, CHINESE ACADEMY OF SCIENCES, Zhejiang (CN)

(72) Inventors: Nan Jiang, Zhejiang (CN); He Li, Zhejiang (CN); Bo Wang, Zhejiang (CN); Jian Yi, Zhejiang (CN); Yang Cao, Zhejiang (CN)

(73) Assignee: NINGBO INSTITUTE OF MATERIALS TECHNOLOGY & ENGINEERING, CHINESE ACADEMY OF SCIENCES, Zhejiang (CN)

( * ) Notice: Subject to any disclaimer, the term of this patent is extended or adjusted under 35 U.S.C. 154(b) by 0 days.

(21) Appl. No.: 17/043,395

(22) PCT Filed: Apr. 18, 2018

(86) PCT No.: PCT/CN2018/083523
§ 371 (c)(1),
(2) Date: Sep. 29, 2020

(87) PCT Pub. No.: WO2019/184019
PCT Pub. Date: Oct. 3, 2019

(65) Prior Publication Data
US 2021/0140038 A1    May 13, 2021

(30) Foreign Application Priority Data
Mar. 29, 2018  (CN) .................. 201810273492.X (51) Int. Cl.
*C23C 16/27* (2006.01)
*C23C 16/01* (2006.01)
(Continued)

(52) U.S. Cl.
CPC ............ *C23C 16/272* (2013.01); *C23C 16/01* (2013.01); *C23C 16/0254* (2013.01); *C23C 16/271* (2013.01); *C23C 16/50* (2013.01)

(58) Field of Classification Search
CPC ... C23C 16/272; C23C 16/01; C23C 16/0254; C23C 16/271; C23C 16/50
See application file for complete search history.

(56) References Cited

U.S. PATENT DOCUMENTS

| | | | |
|---|---|---|---|
| 5,366,522 A | 11/1994 | Nakamura et al. | |
| 6,370,165 B1 | 4/2002 | Badzian et al. | |
| 2012/0056199 A1* | 3/2012 | Rosiwal | C04B 37/005 257/77 |

FOREIGN PATENT DOCUMENTS

| CN | 1107900 A | 9/1995 |
|---|---|---|
| CN | 1844450 A | 10/2006 |

(Continued)

OTHER PUBLICATIONS

Mallik et al. Synthesis and characterisation of freestanding diamond coatings, Indian Journal of Engineering and Materials Science, vol. 20, Dec. 2013, pp. 522-532. (Year: 2013).*
(Continued)

*Primary Examiner* — Kelly M Gambetta
(74) *Attorney, Agent, or Firm* — Hamre, Schumann, Mueller & Larson, P.C.

(57) ABSTRACT

A self-supporting ultra-fine nanocrystalline diamond thick film, the thickness being 100-3000 microns, wherein 1 nanometer≤diamond grain size≤20 nanometers. A method for using chemical vapor deposition to grow ultra-fine
(Continued)

nanocrystalline diamond on a silicon substrate, and separating the silicon substrate and the diamond to acquire the self-supporting ultra-fine nanocrystalline diamond thick film. The chemical vapor deposition method is simple and effective, and prepares a high-quality ultra-fine nanocrystalline diamond thick film.

10 Claims, 6 Drawing Sheets

(51) Int. Cl.
    *C23C 16/50*     (2006.01)
    *C23C 16/02*     (2006.01)

(56) References Cited

FOREIGN PATENT DOCUMENTS

| | | | |
|---|---|---|---|
| CN | 102212795 A | | 10/2011 |
| CN | 102212795 B | * | 4/2013 |
| CN | 104561925 A | | 4/2015 |
| CN | 105506576 A | | 4/2016 |
| EP | 1662023 A1 | | 5/2006 |

OTHER PUBLICATIONS

Griffin et al. Role of inert gas in the low-temperature nano-diamond chemical vapour deposition process, Nanotechnology, 17(5), 2006, pp. 1225-1229. (Year: 2006).*

Srikanth, Review of advances in diamond thin film synthesis, Proc. IMechE vol. 226 Part C: J. Mechanical Engineering Science, pp. 303-3018. (Year: 2011).*

International Search Report (in English and in Chinese) and Written Opinion published in PCT/CN2018/083523, dated Jan. 4, 2019, 10 pages provided.

Rongfa Chen, "Research on Key Techniques of Application of Optical Grade Thick Diamond Films in Infrared Windows", Doctoral dissertation, Nanjing University of Aeronautics and Astronautics, dated Oct. 31, 2008, with English Abstract, 135 pages provided, cited in International Search Report.

Office Action issued in corresponding Chinese Application No. CN201810273492.X, dated Jan. 22, 2021, with English machine translation, 13 pages.

* cited by examiner

SELF-SUPPORTING ULTRA-FINE NANOCRYSTALLINE DIAMOND THICK FILM

TECHNICAL FIELD

The invention relates to a self-supporting ultra-fine nanocrystalline diamond thick film and belongs to the field of diamond materials.

BACKGROUND ART

Due to the special crystal structure and bonding pattern, diamond has many excellent properties such as high hardness, wear resistance, corrosion resistance, high melting point, wide band gap, high light transmittance, and excellent physical and chemical stability. It has a wide range of applications in mechanical processing, marine dynamic sealing, micro-electromechanical systems, field emission, optical windows, electrochemistry, acoustics, biomedicine and other fields.

At present, there are two kinds of common diamonds, namely single crystal diamond and polycrystalline diamond. Single crystal diamonds have excellent performance, but natural single crystal diamonds are scarce, expensive, and small in size. They are mainly used in the jewelry industry. Industrial single crystal diamonds are often prepared by high temperature, high pressure and chemical vapor deposition (CVD) methods. There is residual metal catalyst inside the diamond prepared at high temperature and high pressure, which greatly reduces its performance. The performance of single crystal diamond prepared by CVD can be comparable to that of natural single crystal diamond, and it can even surpass natural single crystal diamond in terms of mechanical properties and purity, but it is difficult to prepare and very expensive. In addition, both natural and artificial single crystal diamonds have the disadvantage of anisotropy, which is caused by the crystal structure of diamond itself, cannot be overcome and limits its application.

Polycrystalline diamonds generally exist in the form of CVD diamond film, and are divided into microcrystalline diamond, nanocrystalline diamond and ultra-fine nanocrystalline diamond. Microcrystalline diamond (grain size is greater than 100 nm) has good crystallinity, large grain size, no anisotropy, and high hardness. However, the fracture toughness is low, and the surface roughness of the film is relatively large. Before use, it usually requires laser cutting and polishing, which increase the processing procedures and costs, thus limiting the mass industrial application of micron diamonds. The physical and chemical properties of nanocrystalline diamond (grain size is less than 100 nm and greater than 20 nm) are similar to those of microcrystalline diamond, and the smaller grain size makes its surface roughness much lower than that of microcrystalline diamond. It has high fracture toughness, and the time and cost of the surface grinding and polishing process are greatly reduced. Compared with nanocrystalline diamond, the ultra-fine nanocrystalline diamond film (grain size is less than 20 nm) has a very high secondary nucleation rate during the growth process, and the grain size will not increase as the thickness increases. The existences of extremely small grains, a large number of grain boundaries and graphite phases in the thin film make it have many excellent properties, such as isotropy, extremely low friction coefficient, high field emission coefficient, high infrared transmittance, high fracture toughness and easy doping, which greatly broaden the application fields of diamond films. It has potential applications in many fields such as dynamic sealing and ultra-precision processing, micro-electromechanical systems, electrochemistry and biomedicine and the like. In addition, the surface of the film is extremely smooth and it can be used directly without mechanical polishing, so that the ultra-fine nanocrystalline diamond have great advantages in the field of mechanical processing and dynamic sealing.

Therefore, the development of a self-supporting ultra-fine nanocrystalline diamond thick film is very important to improve the application of diamond in high-precision industries.

SUMMARY OF THE INVENTION

The object of the present invention is to provide a self-supporting ultra- diamond thick film.

In the first aspect of the present invention, it provides a self-supporting ultra-fine nanocrystalline diamond thick film, wherein the thick film has a thickness of 100-3000 microns, and a diamond grain size of 1 nm≤diamond grain size≤20 nm.

In another preferred embodiment, the thick film is circular and has a diameter of 50-100 mm.

In another preferred embodiment, the surface of the thick film is smooth.

In another preferred embodiment, in the thick film, the diamond grain size is ≥2 nm and ≤16 nm.

In another preferred embodiment, the thickness of the thick film is 200-1000 μm.

In the second aspect of the present invention, it provides a method for preparing the self-supporting ultra-fine nanocrystalline diamond thick film according to the first aspect, wherein the deposition of the ultra-fine nanocrystalline diamond thick film is completed through two steps of direct current hot cathode glow discharge chemical vapor deposition and hot filament chemical vapor deposition.

The preparation method of the present invention comprises the following steps:

(i) growing an ultra-fine nanocrystalline diamond layer with a thickness of 5 to 200 μm on a surface of a silicon wafer by direct current hot cathode glow discharge chemical vapor deposition;

(ii) growing ultra-fine nanocrystalline diamond on the ultra-fine nanocrystalline diamond layer by hot filament chemical vapor deposition to obtain an ultra-fine nanocrystalline diamond thick film;

(iii) separating the ultra-fine nanocrystalline diamond thick film from the silicon wafer, thereby obtaining a self-supporting ultra-fine nanocrystalline diamond thick film.

In another preferred embodiment, the silicon wafer is one that has been ground by ultra-fine nanocrystalline diamond powder. In another preferred embodiment, the particle size of the ultra-fine nanocrystalline diamond powder is 5-15 nm.

In another preferred embodiment, the preparation method further comprises a step of nucleating treatment of the silicon wafer before step i).

In another preferred embodiment, the nucleation treatment is carried out in hydrogen and methane, the flow rate of hydrogen is 200-800 sccm, the concentration of methane is 4.0-7.0%, the working pressure is 2.5-5.0 kPa, the nucleation temperature is 700-800° C., and the nucleation time 20-40 min.

In another preferred embodiment, in step i), the growth atmosphere is hydrogen, methane and inert gas. In another preferred embodiment, the inert gas is nitrogen or argon.

In another preferred embodiment, in step i), the flow rate of hydrogen is 200-800 sccm, the concentration of methane is 1.5-4.0%, and the concentration of inert gas is 10-60%. In another preferred embodiment, in step i), the flow rate of hydrogen is 300-700 sccm, and preferably, the flow rate of hydrogen is 400-600 sccm.

In another preferred embodiment, in step i), the growth pressure is 2-5 kPa, the growth temperature is 750-850° C., the distance between cathode and anode is 50-75 mm, and the growth time is 2-80 hours.

In another preferred embodiment, in step ii), the growth atmosphere is hydrogen, methane and inert gas. In another preferred embodiment, the inert gas is nitrogen or argon.

In another preferred embodiment, in step ii), the flow rate of hydrogen is 200-800 sccm, the concentration of methane is 2-6%, and the concentration of inert gas is 10-20%. In another preferred embodiment, the flow rate of hydrogen is 300-700 sccm, and preferably the flow rate of hydrogen is 400-600 sccm.

In another preferred embodiment, in step ii), the growth pressure is 1.5-2.5 kPa, and the growth time is 30-1000 hours.

In another preferred embodiment, in step ii), the hot filament is 3-20 tantalum wires with a diameter of 0.1-0.6 mm, the distance between the hot filament and the sample is 13-15 mm, and the power of each tantalum wire is 0.8-1.2 kW.

In another preferred embodiment, the hot filament is one that is carbonized in a mixed gas of hydrogen and methane. In another preferred embodiment, the carbonization pressure is 2-3 kPa, the flow rate of hydrogen is 200-800 sccm, the concentration of methane is 2-6%, and the carbonization time is 10-30 min. In another preferred embodiment, the flow rate of hydrogen is 300-700 sccm, and preferably the flow rate of hydrogen is 400-600 sccm.

In another preferred embodiment, in step iii), the silicon wafer is etched and completely dissolved in a mixture of hydrofluoric acid and nitric acid, thereby obtaining the self-supporting ultra-fine nanocrystalline diamond thick film.

It is to be understood that above each technical feature and each technical feature specifically described hereinafter (as in the examples) within the scope of the present invention may be combined with each other to constitute a new or preferred technical solution. Each feature disclosed in the specification can be replaced by any alternative feature that provides the same, equal or similar purpose. Due to space limitations, those will not be redundantly repeated herein.

DETAILED DESCRIPTION

The inventors of the present application have conducted extensive and intensive research and have developed an ultra-fine nanocrystalline diamond thick film for the first time, with a thickness of 100-3000 microns and 1 nm≤diamond grain size≤20 nm. The present invention adopts a chemical vapor deposition method to grow ultra-fine nanocrystalline diamond on a silicon substrate, and then separates the silicon substrate from the diamond to obtain a self-supporting ultra-fine nanocrystalline diamond thick film. The present invention provides a simple and effective chemical vapor deposition method to prepare a high-quality ultra-fine nanocrystalline diamond thick film. On this basis, the present invention has been completed.

Preparation Method

The diamond grown by direct current hot cathode chemical vapor deposition has good quality and strong bonding force to the substrate, and it is not easy to separate. However, if the growth time is too long, carbon deposit will occur at cathode, while hot filament chemical vapor deposition can grow diamond for a long time. Therefore, the chemical vapor deposition of ultra-fine nanocrystalline diamond thick film is divided into two stages.

The first stage is finished in a direct current hot cathode glow discharge chemical vapor deposition (DCCVD) equipment. A layer of ultra-fine nanocrystalline diamond with a thickness of 5 to 200 μm is grown on the surface of a silicon wafer, and the growth time is 2-80 hours.

The diamond grown by DCCVD has high purity and good quality. The stress between the grown diamond film and the silicon wafer is small, the bonding force is large, and it is not easy to crack.

In order to prevent the diamond film from bending or falling off due to stress, a thicker silicon substrate (silicon wafer) with a thickness of 500-3000 μm is used. Before diamond growth, the silicon wafer must be ground with nano-diamond powder. The silicon wafer is washed with deionized water, and then ultrasonicated in alcohol containing nano-diamond powder to increase the nucleation density of diamond. The ultrasonicated silicon substrate is cleaned with deionized water, dried with nitrogen gas and then subjected to chemical vapor deposition.

The gas atmosphere for diamond growth is hydrogen, methane and inert gases (nitrogen, argon, etc.). Among them, methane is the gas carbon source for diamond growth, hydrogen can etch away the graphite phase produced during the diamond deposition process, and inert gas is used to reduce the grain size of diamond growth. The methane is ionized to produce carbon-containing groups under the action of the energy generated by the direct current discharge, and the diamond is deposited on the silicon substrate, but the graphite phase is also generated at the same time. The hydrogen plasma is used to etch the graphite, thereby leaving the diamond. When hydrogen plasma etches the graphite phase, it also etches diamond, but the etch rate for graphite is much higher than that for diamond (about 50 times), so diamond can grow in a hydrogen-rich atmosphere. DCCVD uses the energy generated by direct current discharge to ionize the gas into plasma. The carbon-containing groups in the plasma are deposited on the silicon substrate by diffusion and adsorption. After dehydrogenation, the $sp^3$ phase diamond is formed, and the deposited graphite is etched by using the hydrogen plasma to form a diamond film. Inert gases such as nitrogen, argon and the like can inhibit the growth of diamond grains and promote the continuous secondary nucleation of diamonds, thereby forming ultra-fine nanocrystalline diamond film.

The second stage growth of ultra-fine nanocrystalline diamond thick film is finished in hot filament chemical vapor deposition (HFCVD) equipment. Although the diamond grown by DCCVD has few impurities and high quality, carbon deposits occur at the cathode during the long-term growth process, and the glow discharge cannot be performed stably. The long-term growth of diamond can be performed by HFCVD, so that the second stage of growth of ultra-fine nanocrystalline diamond thick film is carried out through HFCVD.

The gas conditions for growth and deposition principles of HFCVD are basically the same as those of DCCVD. However, the plasma in HFCVD is excited by the heat generated by the hot filament, so that carbon deposition will not occur, and the diamond film can be grown for a long time. After the silicon wafer is subjected to DCCVD growth, it also needs to be cleaned with deionized water and dried with nitrogen. The gas atmosphere in the HFCVD growth process is the same as that of DCCVD, which is a mixture of hydrogen, methane and inert gas. The hot filament used in HFCVD is tantalum wire. Before growth, the tantalum wire is carbonized in the mixed gas of hydrogen and methane to form a layer of tantalum carbide on the surface, thereby improving the stability and service life of the tantalum wire. Then the chemical vapor deposition starts. The growth time is 30-1000 hours, and the thickness of the ultra-fine nanocrystalline diamond film is 100-3000 μm.

The ultra-fine nanocrystalline diamond thick film prepared after two-stage chemical vapor deposition needs to be separated from the silicon substrate by etching away the silicon substrate, thereby obtaining a self-supporting ultra-fine nanocrystalline diamond thick film. The etching solution is a mixture of hydrofluoric acid and nitric acid. The silicon wafer can be chemically reacted with hydrofluoric acid to dissolve the silicon wafer, but the speed is very slow. After nitric acid is added, the chemical reaction can proceed violently, forming $H_2SiF_6$, thereby quickly etching away the silicon substrate. Because the chemical properties of diamond are very stable, it will not react with the mixture of hydrofluoric acid and nitric acid. Therefore, after the silicon substrate is completely etched away, a self-supporting ultra-fine nanocrystalline diamond thick film is successfully obtained.

The present invention is beneficial in that it provides a simple and effective two-step chemical vapor deposition method for preparing ultra-fine nanocrystalline diamond thick film on a silicon substrate, wherein the thick film has high hardness, toughness, isotropy, and an extremely smooth surface. It overcomes a series of problems of grinding, polishing and anisotropy in the application of diamond materials.

The self-supporting diamond ultra-fine nanocrystalline diamond thick film has not only high hardness, but also very good toughness. It is an ideal material for manufacturing ultra-precision machining cutter. Compared with single crystal diamond, the nanocrystalline diamond thick film overcomes the shortcomings of anisotropy, is more suitable for manufacturing ultra-precision machining cutter, and is not prone to chipping. In addition, the surface of the self-supporting diamond ultra-fine nanocrystalline diamond thick film is extremely smooth, and it can be applied to mechanical processing, dynamic sealing and other fields without mechanical polishing, thereby solving the problems of diamond grinding and polishing.

The present invention will be further explained below in conjunction with specific examples. It should be understood that these examples are only used to illustrate the present invention and not to limit the scope of the present invention. The experimental methods without specific conditions in the following examples are usually conducted in accordance with conventional conditions or in accordance with the conditions recommended by the manufacturer. Unless otherwise specified, percentages and parts are percentages by weight and parts by weight.

Unless otherwise defined, all professional and scientific terms used herein have the same meanings as those familiar to those skilled in the art. In addition, any methods and materials similar or equivalent to the content described can be applied to the method of the present invention. The preferred embodiments and materials described herein are for demonstration purpose only.

EXAMPLE 1

A silicon (100) surface with a diameter of 50-100 mm and a thickness of 500-3000 μm was used for chemical vapor deposition of ultra-fine nanocrystalline diamond thick film. Before being deposited, in order to increase the nucleation density of diamond to grow ultra-fine nanocrystalline diamond, the silicon wafer was ground with ultra-fine nanocrystalline diamond powder to form many nanogrooves on the surface of the silicon wafer to promote diamond nucleation. The ultra-fine nanocrystalline diamond powder had a particle size of 5-15 nm, and the silicon wafer was ground by hand grinding. The ground silicon wafer was ultrasonically cleaned with deionized water, then it was subjected to ultrasonic treatment in an alcohol suspension containing ultra-fine nanocrystalline diamond powder, and seeding was performed on the surface of the silicon. The ultrasound time was 5-30 min. High density ultra-fine nanocrystalline diamond powder was remained on the surface of the silicon wafer ultrasonicated in the diamond powder suspension, and was used as the initial nucleation point for diamond chemical vapor deposition. The residual alcohol on the silicon substrate after seeding was dried with nitrogen before depositing the diamond film, otherwise it would affect the vacuum of the chemical vapor deposition equipment.

The first stage of diamond film growth was carried out in DCCVD with a maximum power of 45 kW. The gas atmosphere for diamond growth was hydrogen, methane and inert gases (nitrogen, argon, etc.). The purity of hydrogen was 99.9%, the purity of methane was 99.99%, and the purity of inert gas was 99.9%. The nucleation treatment was performed before the diamond was growth. The nucleation was carried out in a mixed gas of hydrogen and methane, the flow rate of hydrogen was 400-800 sccm, the concentration of methane was 4.0-7.0%, the working pressure was 2.5-5.0 kPa, the nucleation temperature was 700-800° C., and the nucleation time was 20-40 min. After the nucleation was completed, diamond growth was performed. The process parameters of the growth process were different from those of the nucleation process. The growth process was carried out in a mixed gas of hydrogen, methane and inert gas. The flow rate of hydrogen was 600 sccm (standard cubic centimeters per minute), the concentration of methane was 1.5-4.0%, and the concentration of inert gas was 10-60%. The growth pressure was 2-5 kPa, the growth temperature was 750-850° C., the distance between anode and cathode was 50-75 mm, the growth time was 2-80 hours, and the thickness of the ultra-fine nanocrystalline diamond film was 5-200 μm.

The second stage of diamond film growth was carried out in HFCVD. The ultra-fine nanocrystalline diamond film grown in DCCVD was washed with deionized water and dried with nitrogen, and then placed in HFCVD to grow in thickness. The hot filament for growth by HFCVD was 3-20 tantalum wires with a diameter of 0.1-0.6 mm. The distance between the hot filament and the sample was 13-15 mm, and the power of each tantalum wire was 0.8-1.2 kW. Before growth, the tantalum wires were first carbonized in a mixed gas of hydrogen and methane to improve the stability and service life thereof. The carbonization pressure was 2 kPa, the flow rate of hydrogen was 400 sccm, the concentration of methane was 2%, and the carbonization time was 10-30 min. After the carbonization was completed, the growth of the diamond film was carried out. The growth pressure was reduced to 1.5 kPa, and 10% inert gas was introduced. The growth time was 30-1000 hours, and the thickness of the ultra-fine nanocrystalline diamond film was 100-3000 μm.

After the growth was completed, the ultra-fine nanocrystalline diamond thick film was separated from the silicon substrate by etching away the silicon substrate, thereby obtaining a self-supporting ultra-fine nanocrystalline diamond thick film. The etching solution was a mixture of hydrofluoric acid and nitric acid with a volume ratio of 3:1. The silicon wafer was dissolved by the chemical reaction of $3Si+4HNO_3+18HF=3H_2SiF_6+4NO+8H_2O$. During the reaction process, NO gas was generated during the reaction, so the erosion was carried out in a fume hood. In addition, a large amount of reaction heat was generated during the reaction, and the reaction speed must be controlled to prevent the ultra-fine nanocrystalline diamond thick film from cracking due to heat. Therefore, the etching process was carried out step by step. According to the size of the diamond thick film, the silicon wafer was completely dissolved by adding an etching solution 3 to 5 times.

The prepared ultra-fine nanocrystalline diamond thick film was tested and characterized by scanning electron microscopy, transmission electron microscopy, and Raman spectra.

Figure 1:
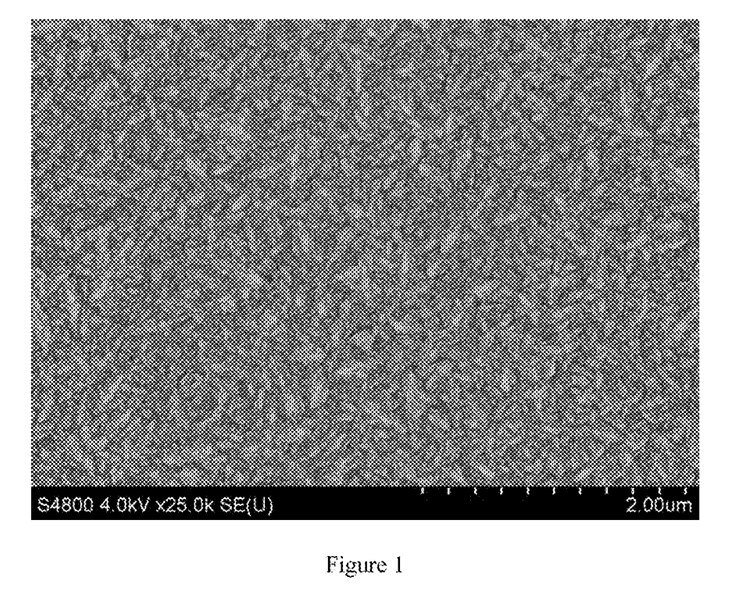
FIG. 1 is a scanning electron micrograph of the plan of the ultra-fine nanocrystalline diamond thick film obtained in Example 1.
Figure 2:
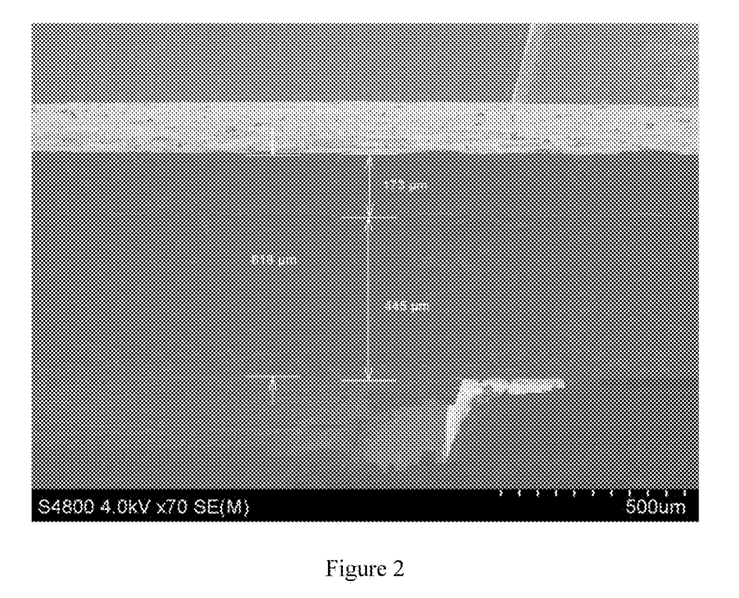
FIG. 2 is a scanning electron micrograph of the cross-section of the ultra-fine nanocrystalline diamond thick film obtained in Example 1.

FIG. 1 is a scanning electron micrograph of the plan of the ultra-fine nanocrystalline diamond thick film. It can be seen from FIG. 1 that the diamond grains are ultra-fine nanocrystals, distributed in needle-like clusters. FIG. 2 is a scanning electron micrograph of the cross-section of the ultra-fine nanocrystalline diamond thick film. It can be seen from FIG. 2 that the thick diamond film is divided into two layers with a total thickness of 618 μm, wherein the thickness of the nucleation layer is 173 μm and the thickness of the growth layer is 445 μm.

Figure 3:
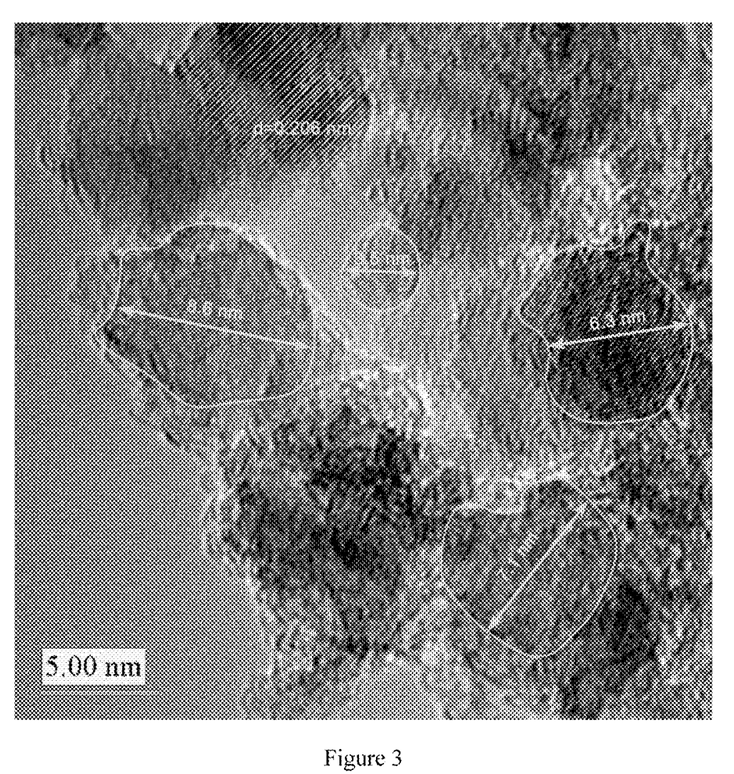
FIG. 3 is a high-resolution transmission electron micrograph of the cross-section of the ultra-fine nanocrystalline diamond thick film obtained in Example 1.

FIG. 3 is a high-resolution transmission electron micrograph of the cross-section of the ultra-fine nanocrystalline diamond thick film. It can be seen from FIG. 3 that the prepared thick diamond film is ultra-fine nanocrystalline diamond, and the sizes of the four crystal grains marked in the figure are 3.5 nm, 6.3 nm, 7.1 nm, and 8.6 nm, respectively.

Figure 4:
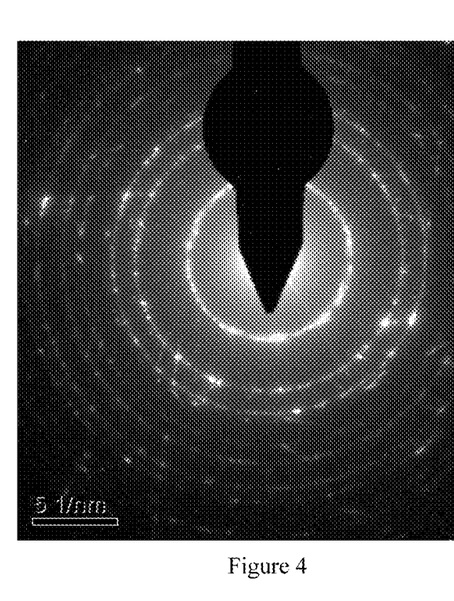
FIG. 4 is an electron diffraction photograph of the selected cross-section area of the ultra-fine nanocrystalline diamond thick film obtained in Example 1.

FIG. 4 is an electron diffraction photograph of the selected cross-section area of the ultra-fine nanocrystalline diamond thick film. It can be seen from FIG. 4 that the diffraction points on the diffraction rings of diamonds at various levels are densely arranged. It is a typical electron diffraction image of nanocrystalline diamond.

Figure 5:
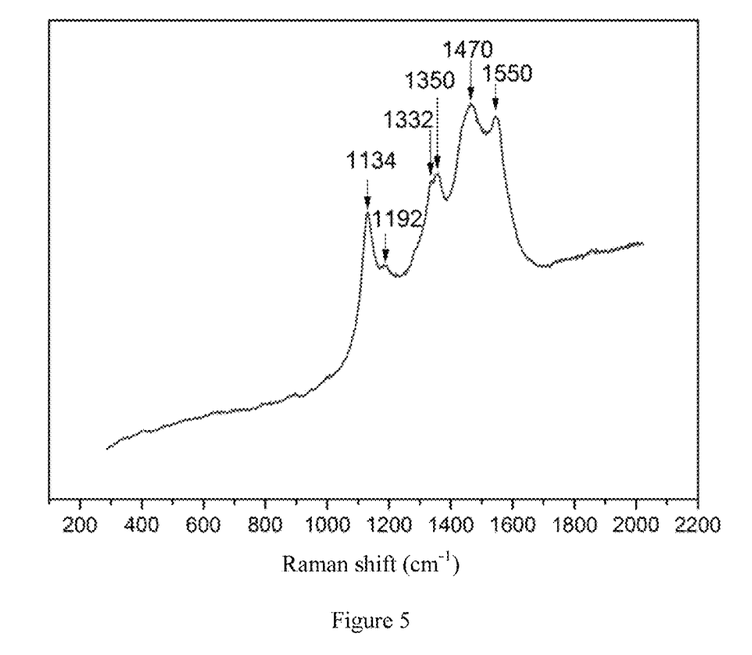
FIG. 5 is a Raman spectrum diagram of the ultra-fine nanocrystalline diamond thick film obtained in Example 1.

FIG. 5 is a Raman spectrum diagram of the ultra-fine nanocrystalline diamond thick film. It can be seen from FIG. 5 that there are 6 Raman peaks of the thick diamond film, which are located at 1134, 1192, 1332, 1350, 1470, and 1550 $cm^{-1}$. It is a typical Raman spectra of nanocrystalline diamond.

Figure 6:
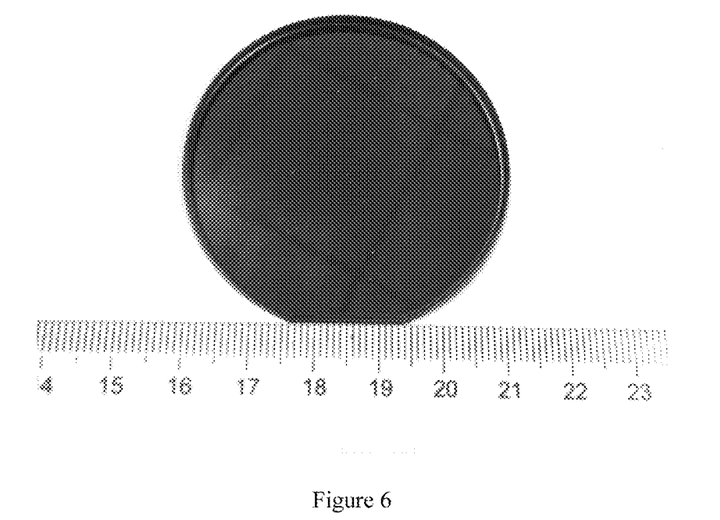
FIG. 6 is an optical photograph of the ultra-fine nanocrystalline diamond thick film obtained in Example 1.

FIG. 6 is an optical photograph of the ultra-fine nanocrystalline diamond thick film. It can be seen from FIG. 6 that the diameter of the diamond thick film is 50 mm, and the surface is mirror-like and extremely smooth.

Figure 7:
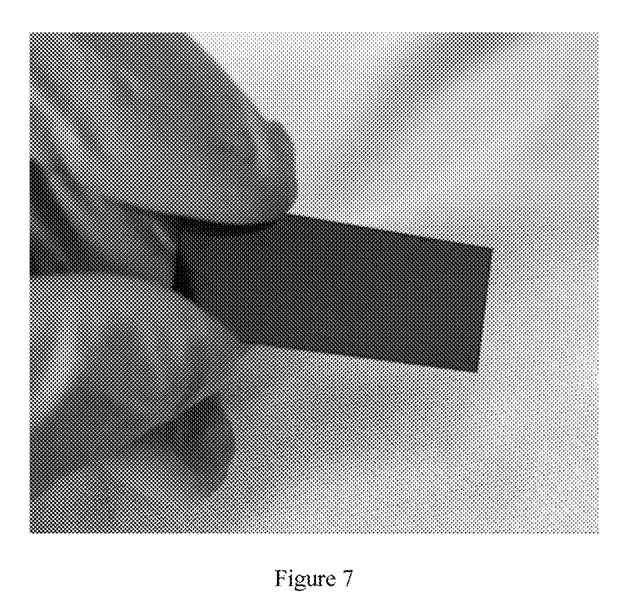
FIG. 7 is an optical photograph of the ultra-fine nanocrystalline diamond thick film after cutting obtained in Example 1.

FIG. 7 is an optical photograph of the ultra-fine nanocrystalline diamond thick film after cutting. It can be seen from FIG. 7 that the cut diamond thick film is square with a flat cut.

The obtained self-supporting ultra-fine nanocrystalline diamond thick film was subjected to laser cutting, welded to the cutter body, and then edged, coarsely ground and finely ground to obtain an ultra-fine nanocrystalline diamond precision cutter. The cutting edge of the finished cutter was flat and sharp, and the rake face was very smooth and had a very low roughness.

EXAMPLE 2

A self-supporting ultra-fine nanocrystalline diamond thick film was prepared by using the method of Example 1 to complete the growth of ultra-fine nanocrystalline diamond thick film, except that the distance between the hot filament and the sample was 14 mm, the growth pressure was 1.5 kPa, the concentration of methane was 2%, the concentration of inert gas was 10%, and the growth time was 30-1000 hours.

Figure 8:
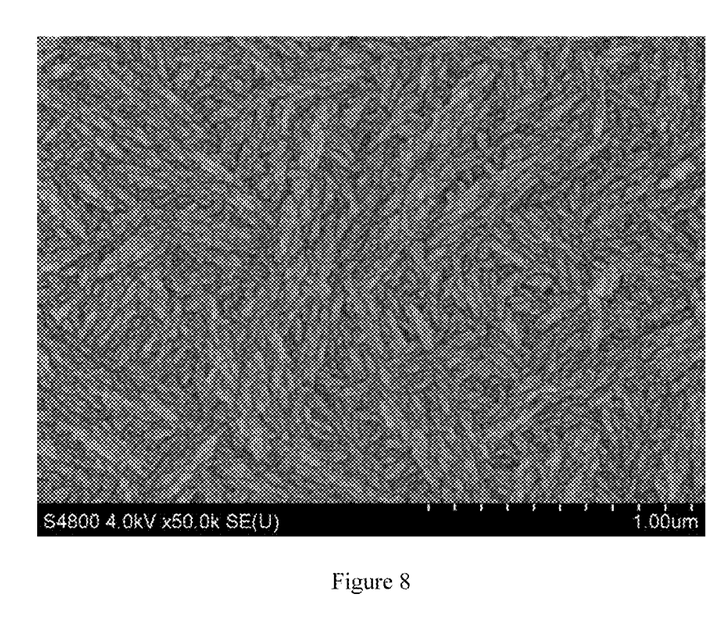
FIG. 8 is a scanning electron micrograph of the plan of the ultra-fine nanocrystalline diamond thick film obtained in Example 2.

FIG. 8 is a scanning electron micrograph of the plan of the ultra-fine nanocrystalline diamond thick film. It can be seen from FIG. 8 that the crystal grains of the diamond thick film are still ultra-fine nanocrystals. Compared with Example 1, the needle-like clusters are more obvious.

Figure 9:
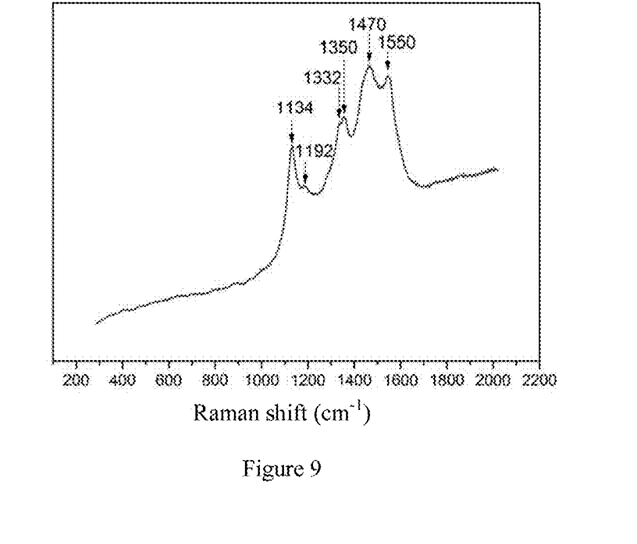
FIG. 9 is a Raman spectrum diagram of the ultra-fine nanocrystalline diamond thick film obtained in Example 2.

FIG. 9 is a Raman spectrum diagram of the ultra-fine nanocrystalline diamond thick film. It can be seen from FIG. 9 that there are 6 Raman peaks of the diamond thick film, which are located at 1134, 1192, 1332, 1350, 1470, 1550 $cm^{-1}$. It is a typical Raman spectra of nanocrystalline diamond.

As measured, the thickness of the thick film was 500 μm, and the average diamond grain size was 10 nm.

EXAMPLE 3

A self-supporting ultra-fine nanocrystalline diamond thick film was prepared by using the method of Example 1 to complete the growth of ultra-fine nanocrystalline diamond thick film, except that the distance between the hot filament and the sample was 15 mm, the growth pressure was 1.5 kPa, the concentration of methane was 2%, the concentration of inert gas was 10%, and the growth time was 30-1000 hours.

Figure 10:
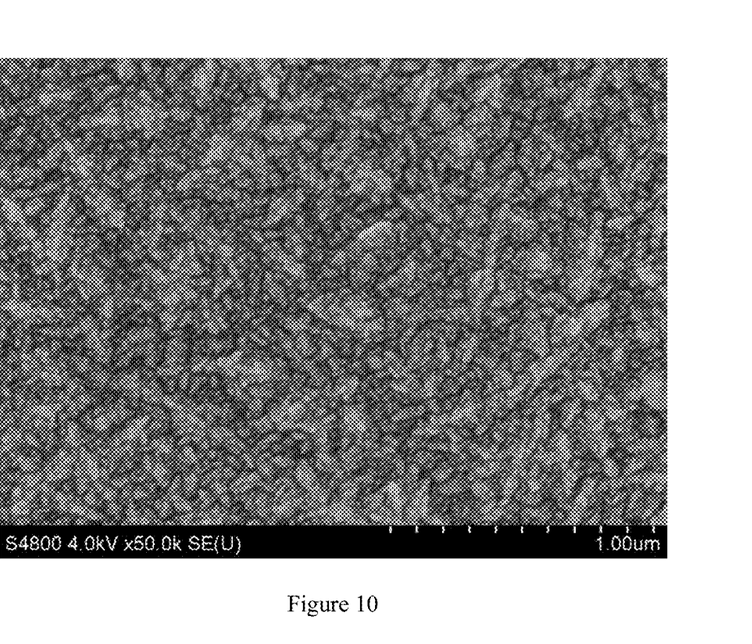
FIG. 10 is a scanning electron micrograph of the plan of the ultra-fine nanocrystalline diamond thick film obtained in Example 3.

FIG. 10 is a scanning electron micrograph of the plan of the ultra-fine nanocrystalline diamond thick film. It can be seen from FIG. 10 that the crystal grains of the diamond thick film are still ultra-fine nanocrystals. Compared with Example 1, the diamond grains were no longer distributed in needle-like clusters.

Figure 11:
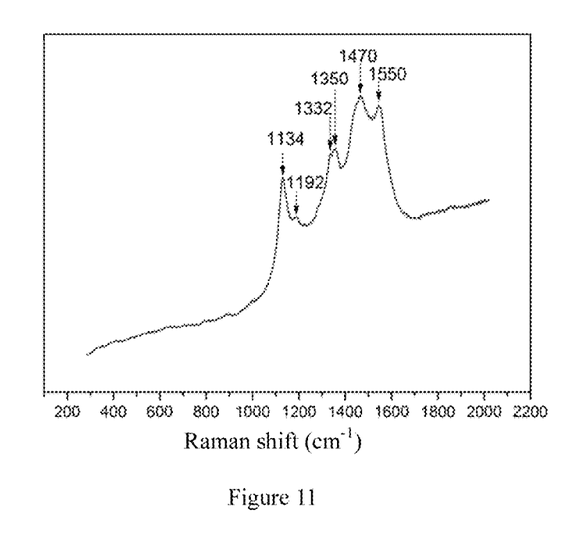
FIG. 11 is a Raman spectrum diagram of the ultra-fine nanocrystalline diamond thick film obtained in Example 3.

FIG. 11 is a Raman spectrum diagram of the ultra-fine nanocrystalline diamond thick film. It can be seen from FIG. 11 that there are 6 Raman peaks of thick diamond film, which are located at 1134, 1192, 1332, 1350, 1470, 1550 cm$^{-1}$. It is a typical Raman spectra of nanocrystalline diamond.

As measured, the thickness of the thick film was 450 μm, and the average diamond grain size was 12 nm.

EXAMPLE 4

A self-supporting ultra-fine nanocrystalline diamond thick film was prepared by using the method of Example 1 to complete the growth of ultra-fine nanocrystalline diamond thick film, except that the distance between the hot filament and the sample was 13 mm, the growth pressure was 2.0 kPa, the concentration of methane was 2%, the concentration of inert gas was 10%, and the growth time was 30-1000 hours.

As measured, the thickness of the thick film was 550 μm, and the average diamond grain size was 8 nm.

EXAMPLE 5

A self-supporting ultra-fine nanocrystalline diamond thick film was prepared by using the method of Example 1 to complete the growth of ultra-fine nanocrystalline diamond thick film, except that the distance between the hot filament and the sample was 13 mm, the growth pressure was 2.5 kPa, the concentration of methane was 2%, the concentration of inert gas was 10%, and the growth time was 30-1000 hours.

As measured, the thickness of the thick film was 500 μm, and the average diamond grain size was 5 nm.

EXAMPLE 6

A self-supporting ultra-fine nanocrystalline diamond thick film was prepared by using the method of Example 1 to complete the growth of ultra-fine nanocrystalline diamond thick film, except that the distance between the hot filament and the sample was 13 mm, the growth pressure was 1.5 kPa, the concentration of methane was 4%, the concentration of inert gas was 10%, and the growth time was 30-1000 hours.

As measured, the thickness of the thick film was 400 μm, and the average diamond grain size was 15 nm.

EXAMPLE 7

A self-supporting ultra-fine nanocrystalline diamond thick film was prepared by using the method of Example 1 to complete the growth of ultra-fine nanocrystalline diamond thick film, except that the distance between the hot filament and the sample was 13 mm, the growth pressure was 1.5 kPa, the concentration of methane was 6%, the concentration of inert gas was 10%, and the growth time was 30-1000 hours.

As measured, the thickness of the thick film was 400 μm, and the average diamond grain size was 10 nm.

EXAMPLE 8

A self-supporting ultra-fine nanocrystalline diamond thick film was prepared by using the method of Example 1 to complete the growth of ultra-fine nanocrystalline diamond thick film, except that the distance between the hot filament and the sample was 13 mm, the growth pressure was 1.5 kPa, the concentration of methane was 6%, the concentration of inert gas was 15%, and the growth time was 30-1000 hours.

As measured, the thickness of the thick film was 350 μm, and the average diamond grain size was 7 nm.

EXAMPLE 9

A self-supporting ultra-fine nanocrystalline diamond thick film was prepared by using the method of Example 1 to complete the growth of ultra-fine nanocrystalline diamond thick film, except that the distance between the hot filament and the sample was 13 mm, the growth pressure was 1.5 kPa, the concentration of methane was 6%, the concentration of inert gas was 20%, and the growth time was 30-1000 hours.

As measured, the thickness of the thick film was 300 μm, and the average diamond grain size was 5 nm.

All documents mentioned in the present invention are cited as references in this application, as if each document is individually cited as a reference. In addition, it should be understood that after reading the above teaching content of the present invention, those skilled in the art can make various changes or modifications to the present invention, and these equivalent forms also fall within the scope defined by the appended claims of the present application.

The invention claimed is:

1. A preparation method for preparing a self-supporting ultra-fine nanocrystalline diamond thick film, the preparation method comprises:
    (i) growing an ultra-fine nanocrystalline diamond layer with a thickness of 5 to 200 μm on a surface of a silicon wafer with a thickness of 500 to 3000 μm by direct current hot cathode glow discharge chemical vapor deposition;
    (ii) growing ultra-fine nanocrystalline diamond on the ultra-fine nanocrystalline diamond layer by hot filament chemical vapor deposition to obtain an ultra-fine nanocrystalline diamond thick film;
    (iii) separating the ultra-fine nanocrystalline diamond thick film from the silicon wafer, thereby obtaining a self-supporting ultra-fine nanocrystalline diamond thick film, wherein
    in step i), a growth atmosphere is hydrogen, methane and inert gas, a flow rate of hydrogen is 200-800 sccm, a concentration of methane is 1.5-4.0%, and a concentration of inert gas is 10-60%;
    in step i), a growth pressure is 2-5 kPa, a growth temperature is 750-850° C., a distance between a cathode and an anode is 50-75 mm, and a growth time is 2-80 hours;
    in step ii), a growth atmosphere is hydrogen, methane and inert gas, wherein a flow rate of hydrogen is 200-800 sccm, a concentration of methane is 2-6%, and a concentration of inert gas is 10-20%;
    in step ii), a hot filament is 3-20 tantalum wires with a diameter of 0.1-0.6 mm, a distance between the hot filament and a sample is 13-15 mm, and a power of each tantalum wire is 0.8-1.2 kW;
    in step ii), the growth pressure is 1.5-2.5 kPa, and the growth time is 30-1000 hours; and
    the self-supporting ultra-fine nanocrystalline diamond thick film having a thickness of 100-3000 microns, and a diamond grain size of 1 nm≤20 nm.

2. The preparation method of claim 1, wherein the preparation method further comprises a step of nucleating treatment of the silicon wafer before step i).

3. The preparation method of claim 1, wherein, the inert gas is nitrogen or argon.

4. The preparation method of claim 3, wherein, in step i), the flow rate of hydrogen is 300-700 sccm.

5. The preparation method of claim 3, wherein, in step ii), the flow rate of hydrogen is 300-700 sccm.

6. The preparation method of claim 1, wherein, in step iii), a mixture of hydrofluoric acid and nitric acid is used to etch the silicon wafer to completely dissolve the silicon wafer, thereby obtaining the self-supporting ultra-fine nanocrystalline diamond thick film.

7. The preparation method of claim 1, wherein the silicon wafer is one that has been grounded by ultra-fine nanocrystalline diamond powder, a particle size of the ultra-fine nanocrystalline diamond powder is 5-15 nm.

8. The preparation method of claim 1, wherein the hot filament is one that is carbonized in a mixed gas of hydrogen and methane at a carbonization pressure, wherein the carbonization pressure is 2-3 kPa, the flow rate of hydrogen is 200-800 sccm, the concentration of methane is 2-6%, and a carbonization time is 10-30 min.

9. The preparation method of claim 2, wherein the nucleating treatment is carried out in hydrogen and methane, a flow rate of hydrogen is 200-800 sccm, a concentration of methane is 4.0-7.0%, a working pressure is 2.5-5.0kPa, a nucleation temperature is 700-800° C., and a nucleation time 20-40 min.

10. The preparation method of claim 1, wherein the self-supporting ultra-fine nanocrystalline diamond thick film has diamond grains distributed in needle-like clusters.

\* \* \* \* \*